United States Patent
Durham et al.

(10) Patent No.: US 6,189,133 B1
(45) Date of Patent: Feb. 13, 2001

(54) COUPLING NOISE REDUCTION TECHNIQUE USING RESET TIMING

(75) Inventors: Christopher McCall Durham, Austin; Marlin Wayne Frederick, Jr., Cedar Park; Peter Juergen Klim; James Edward Dunning, both of Austin, all of TX (US)

(73) Assignees: International Business Machines Corporation, Armonk, NY (US); Motorola, Inc., Schaumburg, IL (US)

( * ) Notice: Under 35 U.S.C. 154(b), the term of this patent shall be extended for 0 days.

(21) Appl. No.: 09/078,786

(22) Filed: May 14, 1998

(51) Int. Cl.$^7$ .................................................. G06F 17/50

(52) U.S. Cl. ................... 716/12; 716/6; 716/11; 716/12; 716/13

(58) Field of Search ........................................ 716/12, 13

(56) References Cited

U.S. PATENT DOCUMENTS

| | | | | |
|---|---|---|---|---|
| 5,550,490 | * | 8/1996 | Durham et al. | 326/98 |
| 5,565,798 | * | 10/1996 | Durham et al. | 326/93 |
| 5,568,395 | * | 10/1996 | Huang | 364/489 |
| 5,618,185 | * | 4/1997 | Aekins | 439/76.1 |
| 5,708,374 | * | 1/1998 | Durham et al. | 326/93 |
| 5,737,614 | * | 4/1998 | Durham et al. | 395/650.04 |

(List continued on next page.)

OTHER PUBLICATIONS

D.A. Kirkpatrick et al., Techniques for Crosstalk Avoidance in the Physical Design of High Performance Digital Systems, IEEE/ACM International Conference on Computer–Aided Design, pp. 616–619, Nov. 1994.*

H–P Tseng et al., Timing and Crosstalk Driven Area Routing, Proceedings of the 1998 Design Automation Conference, pp. 378–381, Jun. 1998.*

J–S. Yim et al., Control Signal Layout Ordering Scheme Minimising Cross–Coupling Effect in Deep Submicrometre Datapath Design, Electronic Letters, pp. 1542–1543, Sep. 1999.*

(List continued on next page.)

Primary Examiner—Paul R. Lintz
Assistant Examiner—A. M. Thompson
(74) Attorney, Agent, or Firm—Anthony V. S. England; Felsman, Bradley, Vaden, Gunter & Dillon, LLP

(57) ABSTRACT

False transitions resulting from capacitive coupling between parallel interconnects driven by dynamic circuits are reduced by classifying interconnects based on the timing of expected data transitions in the signals they carry. Interconnects carrying signals expected to transition during a first portion of a processor cycle are treated as one category, while interconnects carrying signals expected to transition during a second, different portion of the processors cycle are treated as a second category. Interconnects of different categories are interdigitated, a resets of dynamic driving circuits are tuned so that, at any given time, alternate interconnects are "quiet" or stable. Therefore interconnects being driven with data transitions are directly adjacent to quiet lines, and foot devices are implemented as necessary to prevent coupling expected during the reset phase. Such foot devices are implemented within receiving circuits to preclude capacitive coupling between the driven interconnect and the quiet line from having any significant effect. Extra quiet lines may be employed as needed. The evaluation phases of dynamic circuits driving adjacent interconnects may overlap, so that an interconnect within a first category is high or low—but not transitioning—when an adjacent interconnect within a second category is rising or falling, and vice versa. The evaluation phases may also be completely offset, so the an interconnect within a first category is low when an adajcent interconnect within the second category is rising, high, or falling.

24 Claims, 8 Drawing Sheets

U.S. PATENT DOCUMENTS

| | | | |
|---|---|---|---|
| 5,767,009 | * | 6/1998 | Yoshida et al. ........................ 438/613 |
| 5,870,411 | * | 2/1999 | Durham et al. ...................... 371/22.5 |
| 5,883,812 | * | 3/1999 | Fuji ...................................... 364/490 |
| 5,949,098 | * | 9/1999 | Mori ..................................... 257/211 |
| 5,987,241 | * | 11/1999 | Goldberg et al. ................ 395/500.15 |
| 6,009,256 | * | 12/1999 | Tseng et al. ..................... 395/500.34 |
| 6,018,623 | * | 1/2000 | Chang et al. .................... 395/500.07 |
| 6,058,256 | * | 5/2000 | Mellen et al. ................... 395/500.13 |
| 6,065,994 | * | 5/2000 | Hashim et al. ....................... 439/404 |
| 6,081,005 | * | 6/2000 | Fuchigami et al. .................. 257/208 |

OTHER PUBLICATIONS

N. Itazaki et al., A Fault Simulation Method for Corsstalk Faults in Synchronous Sequential Circuits, Proceedings of A Symposium on Fault Tolerant Computing, pp. 38–43, Jun. 1996.*

K.T. Tang et al., Peak Crosstalk Noise Estimation in CMOS VLSI Circuits, The 6th IEEE International Conference on Electronics, Circuits and Systems, pp. 1539–1543, Sep. 1999.*

A. Vittal et al., Crosstalk Reduction for VLSI, IEEE Transactions on Computer–Aided Design of Integrated Circuits and Systems, pp. 290–298, Mar. 1997.*

J. Carothers et al., MCH: A Correct–by–Design Multichip Module Router with Crosstalk Avoidance, Seventh IEEE International Workshop on Rapid System Prototyping, pp. 183–188, Jun. 1996.*

* cited by examiner

COUPLING NOISE REDUCTION TECHNIQUE USING RESET TIMING

BACKGROUND OF THE INVENTION

1. Technical Field

The present invention relates in general to preventing data errors in processors and in particular to preventing data errors created by false transitions occurring as a result of capacitively coupling of interconnects. Still more particularly, the present invention relates to a method of classifying and arranging interconnects within processor execution units so that quiet lines are created between adjacent interconnects when transmitting signals.

2. Description of the Related Art

In complicated reduced instruction set computing (RISC) processor architectures, large numbers of interconnect wires cover and connect the various circuit elements. Many of these interconnect wires run parallel for significant distances, and are therefore subject to noise from capacitive coupling. FIG. 7A depicts an isometric view of four levels of metallization within an integrated circuit. odd numbered wire levels, level one interconnects 710–716 and level three interconnects 730–736, are perpendicular to even numbered wire levels, level two interconnects 720–726 and level four interconnects 740–746. However, interconnects on a particular level are parallel to each other and to interconnects two levels above or below. Therefore, as illustrated in FIG. 7B, which depicts a cross-sectional view of the metallization levels shown in FIG. 7A, parasitic capacitances exist between parallel, adjacent interconnects on the same level (between metal one interconnects 710–712, 712–714, and 714–716, and between metal three interconnects 730–732, 732–734, and 734–736) and between adjacent interconnects which are two levels apart (between metal one interconnect 710 and metal three interconnect 730, between metal one interconnect 712 and metal three interconnect 732, between metal one interconnect 714 and metal three interconnect 734, between metal one interconnect 716 and metal three interconnect 736, and between metal two interconnect 720 and metal four interconnect 740). Capacitances between interconnects on the same level are typically about twice as large as capacitances between interconnects which are two levels apart. A circuit diagram of parallel interconnects within a single metal level (level one of FIG. 7A seen from a plan view) is illustrated in FIG. 7C. Capacitive coupling between parallel interconnects 710–716 may create RC time delays and may be significant to switch transistors at the ends of the interconnects.

Capacitive coupling of metal interconnects may result in false signal transitions, and is therefore of particular concern in dynamic circuits, which are designed for only one transition per cycle, and self-timed circuits, which are designed for only one transition per evaluation window. This problem of false transitions resulting from capacitive coupling may be understood by reference to dynamic circuits and their operation. For example, a typical "domino" dynamic circuit is depicted in FIG. 8, which is a circuit diagram for a single rail buffer. When reset input r_in goes low, p-channel transistor QR3 is turned on, bringing node I2 connected to the gate of n-channel transistor QF5 up to the power supply voltage $V_{DD}$. Transistor QF5, in turn, pulls the output d_out down to the ground voltage GND. Stand-by p-channel transistor QS4, which is connected at the gate to output node d_out, is thus turned on. When reset input r_in goes high while data input d_in is inactive or low, stand-by device QS4 will hold node I2 and the gate of transistor QF1 at the power supply voltage $V_{DD}$, preventing any charge leak off due to junction leakage and/or subthreshold conduction.

When data input d_in subsequently goes high, transistor QF1 is turned on and discharges node I2 to ground, overdriving weak stand-by device QS4. The gates of transistors QF5 and QF6 are thus pulled to ground, turning off transistor QF5 and turning on p-channel transistor QF6. Output d_out is therefore pulled high by output driver QF6. Output d_out thus tracks data input d_in when reset input r_in goes high after having been low.

Foot transistor QR2 is provided to interrupt the path from node I2 through transistor QF1 to ground GND when reset input r_in goes low. This forces output d_out to ground GND even if data input d_in is active when reset input r_in is driven low. Foot transistor QR2 is thus optional an may be eliminated if the design guarantees that data input d_in is always inactive when reset input r_in is low. Furthermore, it should be noticed that transistor QF1 may be replaced by any n-channel transistor combination implementing a boolean expression. Although a single rail buffer is shown, the circuit may also be implemented as a dual rail circuit.

The operation of a dynamic circuit such as that depicted in FIG. 8 may generally be divided into three parts: the reset phase, the standby phase, and the evaluation phase. These operational phases (or states) are illustrated in the timing diagram of FIG. 9. Typically all outputs of the dynamic circuit go low during the reset phase, when reset input r_in goes low in the case of the circuit depicted in FIG. 8. For dual rail circuits, both outputs are generally low as a result of the reset being asserted. Upon removal of the active reset signal, the circuit enters the stand-by phase, during which it is awaiting input data. As the input data arrives at the data input d_in, the circuit begins its evaluation phase.

The circuit depicted in FIG. 8 enters the reset phase or state when reset input r_in goes low, turning on transistor QR3 to charge node I2, and turning off foot transistor QR2 to interrupt the path from node I2 through transistor QF1 to ground GND in case data input d_in is active. The circuit enters the standby phase when reset input r_in goes high, turning off transistor QR3, turning on foot transistor QR2, and turning on stand-by transistor QS4. While data input d_in is inactive, the charge at node I2 is maintained by stand-by device QS4, and transistor QF5 continues to pull the output d_out to ground GND. Because a foot device QR2 is employed and data input d_in is permitted to be active during the reset phase, the stand-by phase is optional for the circuit depicted in FIG. 8.

The evaluation phase is entered when the data arrives at data input d_in after the reset phase is complete. If the data signal received at data input d_in is low, output d_out remains low. If data input d_in goes high, however, once reset input r_in goes high device QF1 is turned on an node I2 is discharged to ground. Device QF5 is turned off, output driver device QF6 is turned on, and output d_out is pulled to the power supply voltage $V_{DD}$.

It should be observed from FIGS. 8 and 9 that output d_out is low during both the reset phase and the standby phase, and is active (if at all) only during the evaluation phase. Thus, there are two distinct quiet levels at the output during the operational phases of a dynamic circuit. Capacitive coupling between metal interconnects driven by the outputs of dynamic circuits will therefore only occur, if at all, during the low-to-high transitions in the evaluation phase or the high-to-low transitions of the reset (precharge) phase of the dynamic circuits driving the interconnects.

It would be desirable, therefore, to provide a method and apparatus for avoiding capacitive coupling of interconnects within a processor employing dynamic circuits. It would further be advantageous to utilize the quiet levels of dynamic circuits to avoid capacitive coupling of interconnects attached to the outputs of the dynamic circuits.

SUMMARY OF THE INVENTION

It is therefore one object of the present invention to provide a method and apparatus for preventing data errors in processors.

It is another object of the present invention to provide a method and apparatus for preventing data errors created by false transitions occurring as a result of capacitively coupling between interconnects.

It is yet another object of the present invention to provide a method apparatus for classifying and arranging interconnects within a processor execution unit so that quiet lines are created between adjacent interconnects when transmitting signals.

The foregoing objects are achieved as is now described. False transitions resulting from capacitive coupling between parallel interconnects driven by dynamic circuits are reduced by classifying interconnects based on the timing of expected data transitions in the signals they carry. Interconnects carrying signals expected to transition during a first portion of a processor cycle are treated as one category, while interconnects carrying signals expected to transition during a second, different portion of the processors cycle are treated as a second category. Interconnects of different categories are interdigitated, and resets of dynamic driving circuits are tuned so that, at any given time, alternate interconnects are "quiet" or stable. Therefore interconnects being driven with data transitions are directly adjacent to quiet lines, and foot devices are implemented as necessary to prevent coupling expected during the reset phase. Such foot devices are implemented within receiving circuits to preclude capacitive coupling between the driven interconnect and the quiet line from having any significant effect. Extra quiet lines may be employed as needed. The evaluation phases of dynamic circuits driving adjacent interconnects may overlap, so that an interconnect within a first category is high or low—but not transitioning—when an adjacent interconnect within a second category is rising or falling, and vice versa. The evaluation phases may also be completely offset, so that an interconnect within a first category is low when an adajcent interconnect within the second category is rising, high, or falling.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
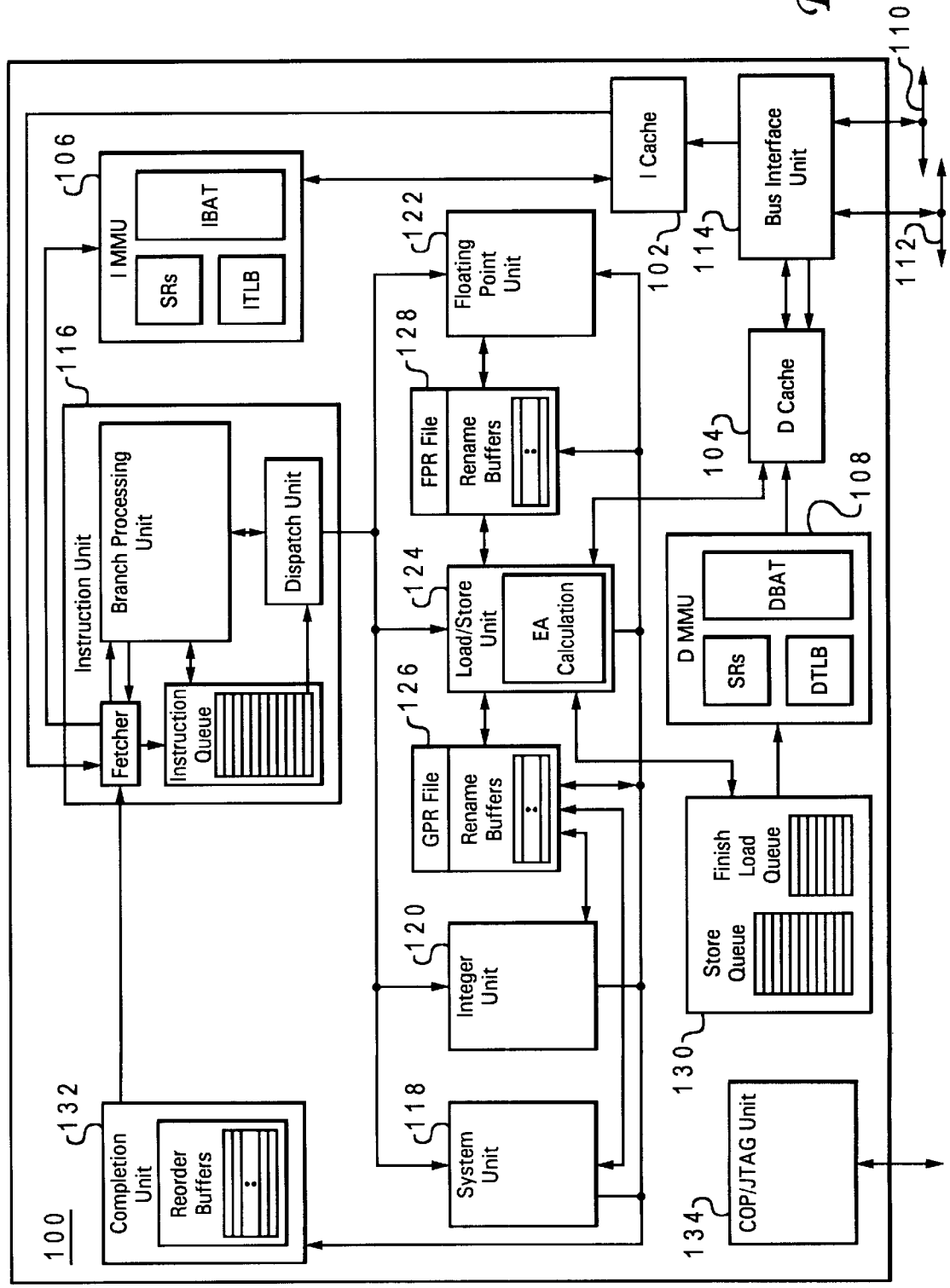
FIG. 1 depicts a block diagram of a processor and related portions of a data processing system in which a preferred embodiment of the present invention may be implemented.

With reference now to the figures, and in particular with reference to FIG. 1, a block diagram of a processor and related portions of a data processing system in which a preferred embodiment of the present invention may be implemented are depicted. Processor 100 is a single integrated circuit superscalar microprocessor, such as the PowerPC™ processor available from IBM Corporation of Armonk, N.Y. Accordingly, processor 100 includes various units, registers, buffers, memories, and other sections, all of which are formed by integrated circuitry. Processor 100 also operates according to reduced instruction set computing ("RISC") techniques.

Processor 100 includes level one (L1) instruction and data caches ("I Cache" and "D Cache") 102 and 104, respectively, each having an associated memory management unit ("I MMU" and "D MMU") 106 and 108. As shown in FIG. 1, processor 100 is connected to system address bus 110 and to system data bus 112 via bus interface unit 114. Instructions are retrieved from system memory (not shown) to processor 100 through bus interface unit 114 and are stored in instruction cache 102, while data retrieved through bus interface unit 114 is stored in data cache 104. Instructions are fetched as needed from instruction cache 102 by instruction unit 116, which includes instruction fetch logic, instruction branch prediction logic, an instruction queue and a dispatch unit.

The dispatch unit within instruction unit 116 dispatches instructions as appropriate to executions units such as system unit 118, integer unit 120, floating point unit 122, or load/store unit 124. System unit 118 executes condition register logical, special register transfer, and other system instructions. Integer or "fixed-point" unit 120 performs add, subtract, multiply, divide, shift or rotate operations on integers, retrieving operands from and storing results in integer or general purpose registers ("GPR File") 126. Floating point unit 122 performs single precision and/or double precision multiply/add operations, retrieving operands from and storing results in floating point registers ("FPR File") 128.

Load/store unit 124 loads instruction operands from data cache 104 into integer or floating point registers 126 or 128 as needed, and stores instructions results when available from integer or floating point registers 126 or 128 into data cache 104. Load and store queues 130 are utilized for these transfers from data cache 104 to and from integer or floating point registers 126 or 128. Completion unit 132, which includes reorder buffers, operates in conjunction with instruction unit 116 to support out-of-order instruction processing, and also operates in connection with rename buffers within integer and floating point registers 126 and 128 to avoid conflict for a specific register for instruction results. Common on-chip processor ("COP") and joint test action group ("JTAG") unit 134 provides a serial interface to the system for performing boundary scan interconnect tests.

The architecture depicted in FIG. 1 is provided solely for the purpose of illustrating and explaining the present invention, and is not meant to imply any architectural limitations. Those skilled in the art will recognize that many variations are possible. Processor 100 may include, for example, multiple integer and floating point execution units to increase processing throughput. All such variations are within the spirit and scope of the present invention.

Figure 2:
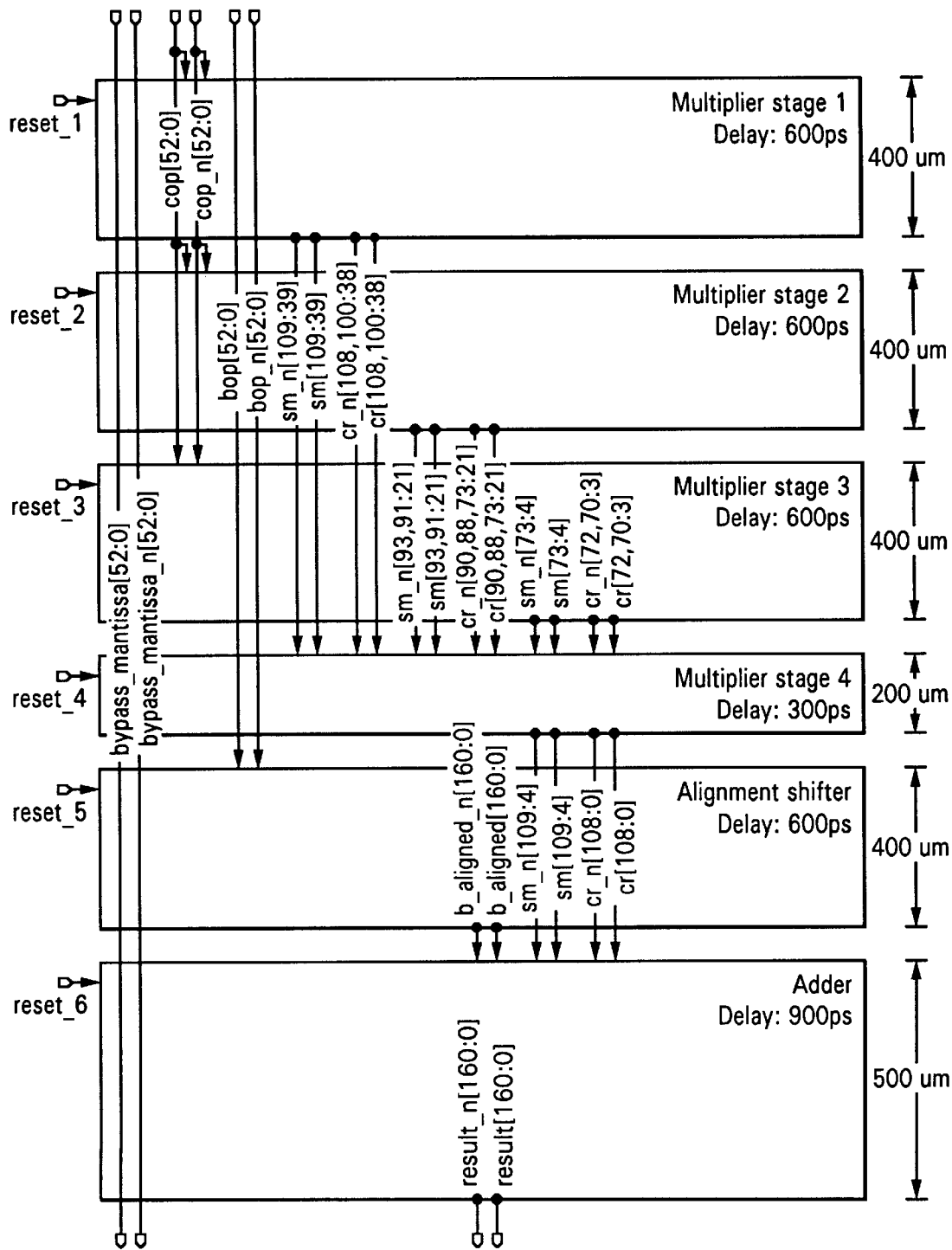
FIG. 2 is a topological diagram of interconnects within a portion of a processor employing offset-timed dynamic circuits and quiet lines in accordance with a preferred embodiment of the present invention.

Referring now to FIG. 2, a topological diagram of interconnects within a portion of a processor employing offset-timed dynamic circuits and quiet lines in accordance with a preferred embodiment of the present invention is illustrated. The problem of capacitive coupling is addressed in the present invention by categorizing interconnects according to their physical location and the timing of the signals they carry, and by adjusting the timing of dynamic circuits driving the interconnects, to insure that each interconnect carrying an active signal is adjacent to one or more "quiet" lines in which no signal transition is occurring. The method of the present invention is illustrated utilizing a floating point execution unit, although the invention finds application in many portions of a processor architecture.

The diagram shown in FIG. 2 illustrates, in block form, the stages of a floating point unit such as floating point unit 122 depicted in FIG. 1. The floating point unit employed as an example implements a fused multiply-add (FMA) operation known in the art, and therefore includes four multiplier stages, an alignment shifter, and an adder. In accordance with the known art, multiplier stages 1–3 may be implemented as 9-to-2 compressors while multiplier stage 4 is implemented as a 6-to-4 compressor. The physical height of each block (in $\mu$m), as well as the delay (in ps) for signals passing through each block to obtain a result, is indicated.

In data flow structures such as floating point units of the type illustrated, large numbers of interconnects run in parallel across the data flow blocks. The data buses required to transmit operand components and intermediate results to, from, and over the logical data flow stages depicted are identified in FIG. 2. For the purposes of simplicity in explaining the invention, it is assumed that all data buses are implemented as interconnects on a single metal level (e.g., metal level 4), although the principles of the present invention apply to interconnects on any one wire level or to interlevel wiring.

Simulation shows that capacitive coupling between parallel interconnect lines may become significant to switch transistors connected to such lines if the length of the interconnect wire exceeds approximately 300 to 500 $\mu$m. Thus, with the exception of buses from multiplier stage 3 to adjacent multiplier stage 4 (sm[73:4], sm_n[73:4], cr[72, 70:3] and cr_n[72, 70:3]), all lines within the buses depicted are subject to capacitive coupling noise if run in parallel with and adjacent to another line.

The first signals to arrive at the floating point unit are those carried by the data cop (cop[52:0] and its complement cop_n[52:0]) and bop (bop[52:0] and its complement bop_n[52:0]) buses. The data transmitted on the cop and bop buses are outputs from latches and arrive at the floating point unit at the beginning of the processor cycle. Multiplier stages 1–3 each receive the cop buses. (Even though the three stages are topologically stacked as shown, their execution of the respective logic functions occurs simultaneously. Considering the delay through each block, it may be concluded that the outputs of multiplier stages 1–3 are generated simultaneously, offset only by the RC time delays associated with 400 $\mu$m of metal for stage 2 and 800 $\mu$m of metal for stage 3. For the purposes of this description, such RC time delays are assumed to be included in the block delays.) The alignment shifter receives the bop buses.

The bypass mantissa buses (bypass_mantissa[52:0] and its complement bypass_mantissa_n[52:0]) carry data signals which arrive at the floating point unit approximately 200 ps after the data signals on the cop and bop busses. The bus lines completely traverse the circuit elements in the blocks depicted and are utilized by a multiplexer (not shown) at the output of the floating point unit. At approximately 600 ps after the processor cycle begins, data signals are ready for transmission on the sum and carry buses connecting multiplier stages 1–2 to multiplier stage 4 (connecting multiplier stage 1 to multiplier stage 4: sm[109:39] and its complement sm_n[109:39], and cr[108, 100:38] and its complement cr[108, 100:38]; connecting multiplier stage 2 to multiplier stage 4: sm[9,91:21] and its complement sm_n[9,91:21], and cr[90,88,73:21] and its complement cr[90,88,73:21]). Finally, at approximately 900 ps after the beginning of the processor cycle, data signals are ready for transmission on the sum and carry buses connecting multiplier stage 4 to the adder.

Figure 3:
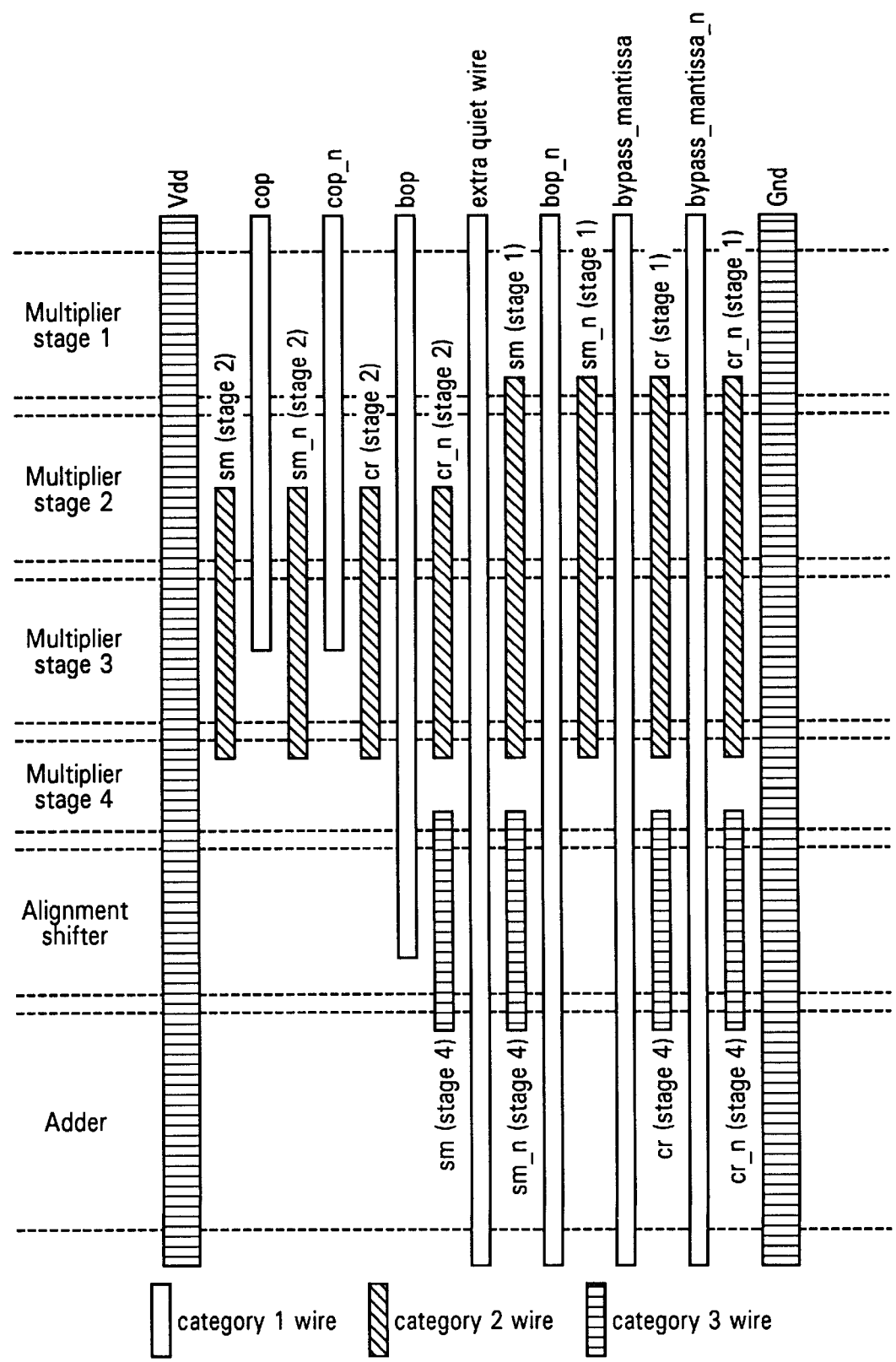
FIG. 3 depicts a topological diagram of categorized, interdigitated interconnects within a portion of a processor employing offset-timed dynamic circuits and quiet lines in accordance with a preferred embodiment of the present invention.

With reference now to FIG. 3, a topological diagram of categorized, interdigitated interconnects within a portion of a processor employing offset-timed dynamic circuits and quiet lines in accordance with a preferred embodiment of the present invention is depicted. The stages of the floating point unit illustrated in FIG. 2 are again delineated, with a single bit position for each of the buses shown in FIG. 2 represented in the topological diagram depicted in FIG. 3. The data buses are categorized based on the timing of data transitions for the signals they carry. Category 1 includes all buses which carry signals which will arrive within 200 ps of the start of the processor cycle. Each of these buses may therefore drive data transitions on the respective interconnects. These category 1 buses include the cop and bop data buses and the bypass mantissa bus.

Category 2 buses for the example shown are those interconnects carrying data generated at approximately 600 ps after the start of the processor cycle, including the sum and carry buses from multiplier stages 1 and 2 to multiplier stage 4. Category 3 buses are those carrying data signals generated at approximately 900 ps after the start of the processor cycle, and thus include the sum and carry buses from multiplier stage 4 to the adder. The sum and carry buses from multiplier stage 3 to multiplier stage 4, the aligned operand buses (b_aligned[160:0] and its complement b_aligned_n[16:0])

from the alignment shifter to the adder, and the result buses (result[160:0] and its complement result_n[160:0]) from the adder to the multiplexer at the floating point unit output are all much shorter than 300 μm. Therefore these buses are not subject to capacitive coupling and may reasonably be ignored.

The interconnects for the buses are categorized based on the expected timings of data transitions. Recall that dynamic circuit will only be driven high, if at all, during the evaluation phase of operation, after the reset and stand-by phases. Data transitions may thus be expected on the interconnects driven by the dynamic circuits when the data output signal is generated in response to the data input signal.

Through the categorization process, interconnects in different categories will carry data transitions driven by dynamic circuits at different times. Data transitions will occur on category 1 interconnects between the start of the processor cycle and 200 ps after the start. Data transitions on category 2 transitions will be driven, if at all between 200 and 600 ps after the start of the processor cycle, while data transitions on category 3 interconnects will be driven, if at all, between 600 and 900 ps after the beginning of the processor cycle.

As shown in FIG. 3, interconnects of different categories are also interdigitated. That is, category 1 interconnects are adjacent to category 2 or category 3 interconnects, but are preferably never parallel with and directly adjacent to—without an intervening interconnect of another category—other category 1 interconnects. Thus, interconnects within a given category adjacent to lines which are "quiet" or stable during the period of expected data transitions. Capacitive coupling is only a concern during such data transitions since steady-state signals will not result in false transitions on adjacent interconnects.

In the example depicted, category 1 wires are driven with active data—and therefore may experience data transitions—at the beginning of each processor cycle (during the first 200 ps or so). During this portion of the processor cycle, all dynamic circuit outputs driving category 2 and category 3 interconnects are low, since the last stage of these driving circuits are in the reset phase. At this time, all category 2 and category 3 interconnects are quiet, and may not be the source of false transitions resulting from capacitive coupling. Additionally, if the dynamic circuits receiving category 2 and category 3 interconnects include foot devices, any noise capacitively coupled to them from the category 1 interconnects has no effect, although some precaution may be necessary to avoid charge sharing. Thus, category 1 interconnects are shielded from each other by category 2 and/or category 3 interconnects, which are quiet at the time of expected data transitions. Similarly, category 2 and 3 interconnects will be shielded from other interconnects of the same category by quiet lines of another category during the portion of the processor cycle in which data transitions are expected on those interconnects.

In order to shield parallel interconnects of one category from each other by intervening interconnects of a different category, the intervening interconnects must be quiet or stable. They may be driven by an output which is either high (and hence in the evaluation phase) or has reset and is low (in the reset phase or stand-by phase). In either case, no switching activity is permissible for output stages driving intervening interconnects when the shielded interconnects are transmitting data transitions.

Referring again to the topology depicted in FIG. 3, interconnects for the floating point unit employed as an example are divided into three categories. Category 1 interconnects include bus lines which carry data arriving during a first portion of the processor cycle, from 0 to 200 ps, including the cop, bop, and bypass mantissa buses. Some of these interconnects—the bypass mantissa bus lines—traverse the entire length of the floating point unit. Category 2 interconnects include bus lines carrying data signals which arrive during a second portion of the processor cycle, from 200 to 600 ps after the beginning, which includes the sum and carry buses from multiplier stages 1 and 2 to multiplier stage 4. Finally, category 3 interconnects are those bus lines carrying data which does not arrive until a last portion of the processor cycle, after 600 ps until the end. For this example, category 3 includes the sum and carry buses from multiplier stage 4 to the adder.

In the upper portion of FIG. 2, category 1 interconnects alternate with category 2 interconnects, while category 1 interconnects are alternated with category 3 interconnects in the lower portion. Some category 1 interconnects traverse the entire length of the floating point unit, while category 2 and category 3 interconnects traverse only a portion of the entire length, and in different regions. Thus, interconnects may also be categorized based on physical location. Category 2 interconnects, if available, could be interdigitated in the lower portion of FIG. 3 with category 1 wires instead of category 3 interconnects. Similarly, category 3 interconnects in the upper portion of FIG. 3, if any should exist, may be utilized instead of category 2 wires as quiet lines between category 1 interconnects, or in place of category 1 interconnects in shielding category 2 wires from each other. However, in the present example, only two different categories of interconnects are found in a given region of the floating point unit. Because of this, category 2 and 3 interconnects could, if necessary, carry data transitions during the same portions of the processor cycle. Interconnects which do not run parallel to each other, but only extend across different regions of a structure, pose no potential for capacitive coupling.

In the exemplary embodiment, category 1 wires are shielded from other category 1 interconnects during a first portion of each processor cycle by category 2 and category 3 interconnects. Similarly, during a middle portion of each processor cycle, category 2 interconnects are shielded by quiet category 1 lines. Quiet category 1 lines also shield category 3 interconnects from each other during the last portion of each processor cycle.

As shown in the depicted example, which includes an unused category 1 interconnect traversing the length of the floating point unit. Extra quiet wires in any category, appropriately connected to foot devices, may be employed, if needed and if space is available, to separate interconnects of a particular category. Although only one extra quiet wire is shown, additional extra quiet wires may be utilized, classified in any or all categories. Additionally, although the processor cycle is segmented into three portions and interconnects are classified using three corresponding categories, any number of nonoverlapping processor sub-periods may be utilized to classify interconnects, and any number of categories may be employed. As described earlier, categories for a given portion of a processor cycle may be subdivided based on physical location if the interconnects within a category never run parallel to each other.

Figure 4:
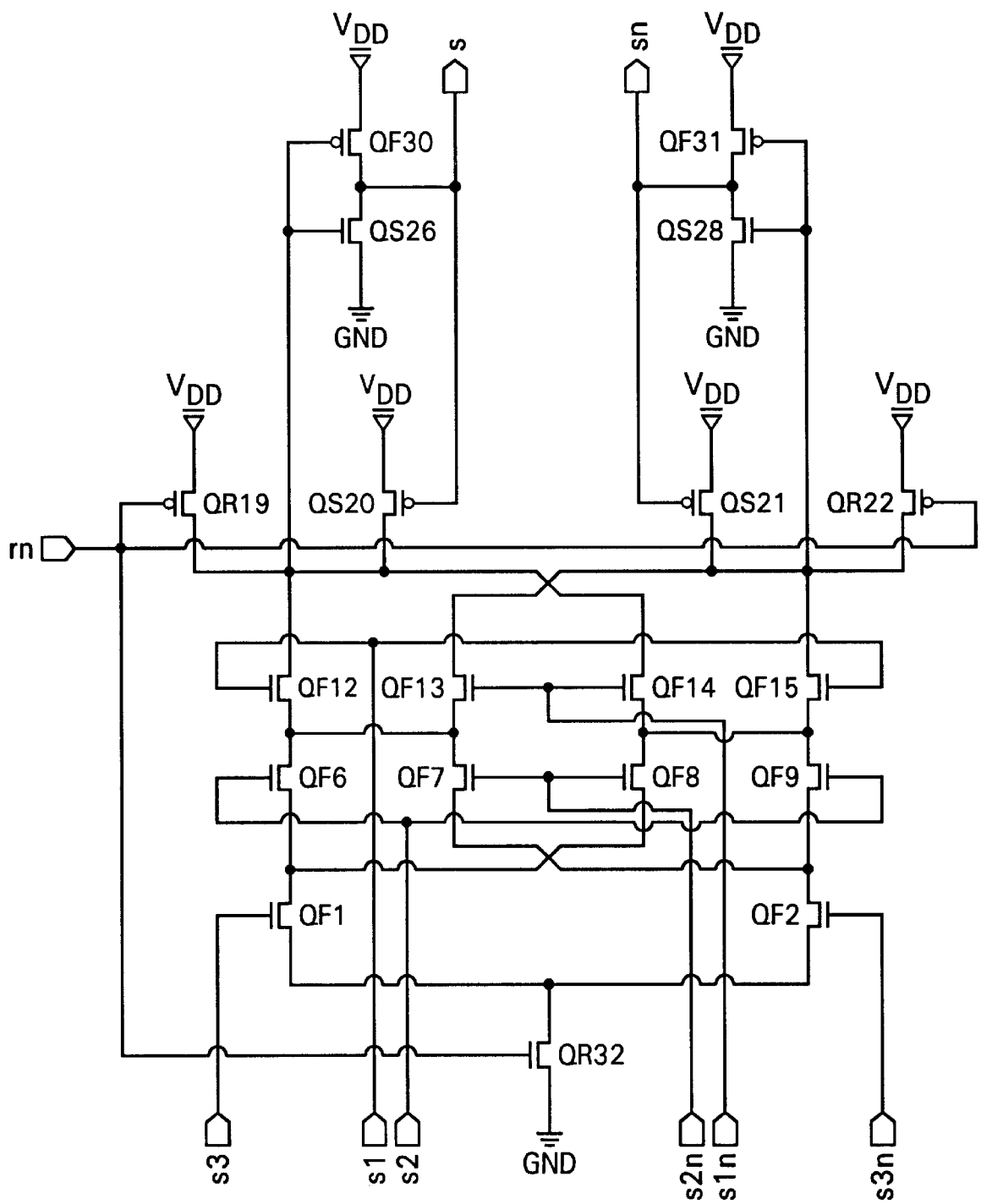
FIG. 4 is a circuit diagram for an off-set timed dynamic circuit driving categorized, interdigitated interconnects within a portion of a processor employing quiet lines in accordance with a preferred embodiment of the present invention.

Referring now to FIG. 4, a circuit diagram for an off-set timed dynamic circuit driving categorized, interdigitated interconnects within a portion of a processor employing quiet lines in accordance with a preferred embodiment of the present invention is illustrated. The circuit shown is a dual rail, domino dynamic circuit including a foot transistor and implementing a carry save adder (CSA), which might be utilized in the compressors of a multiplier stage. The sum-only portion of a CSA circuit is illustrated.

Figure 8:
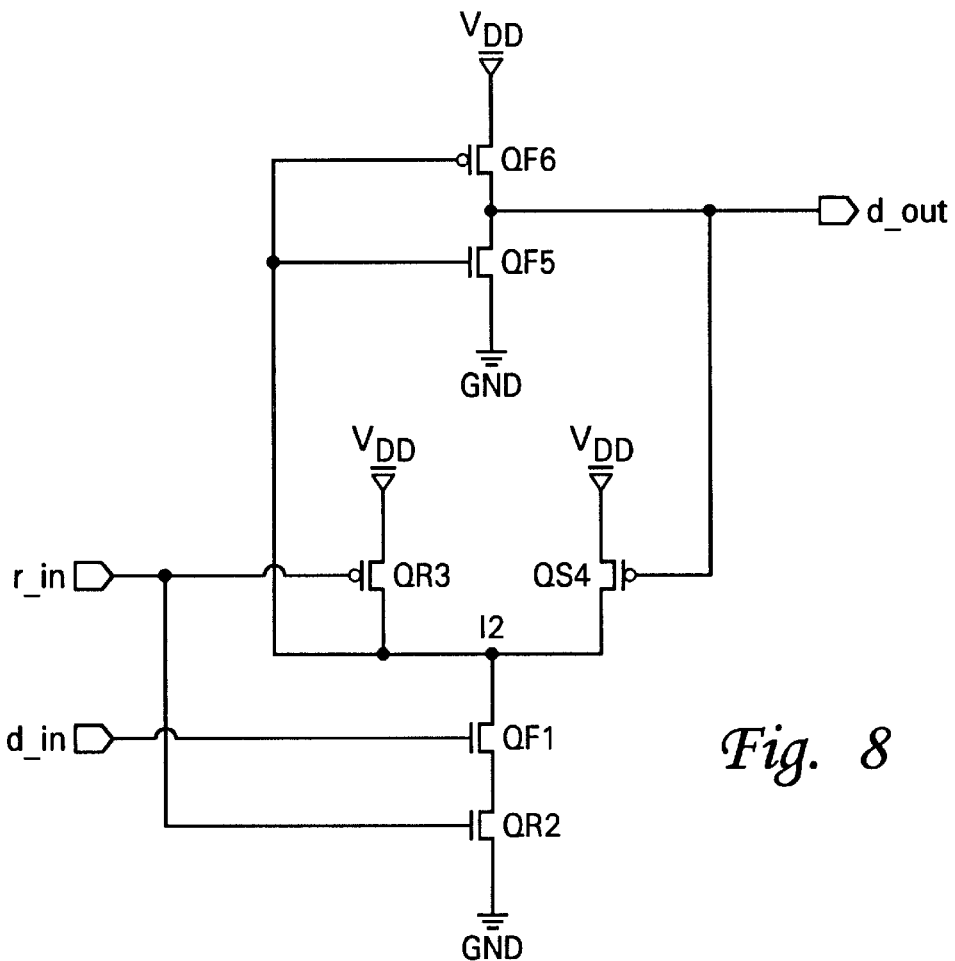
FIG. 8 is a circuit diagram for a footed "domino" dynamic circuit implementing a buffer.
Figure 9:
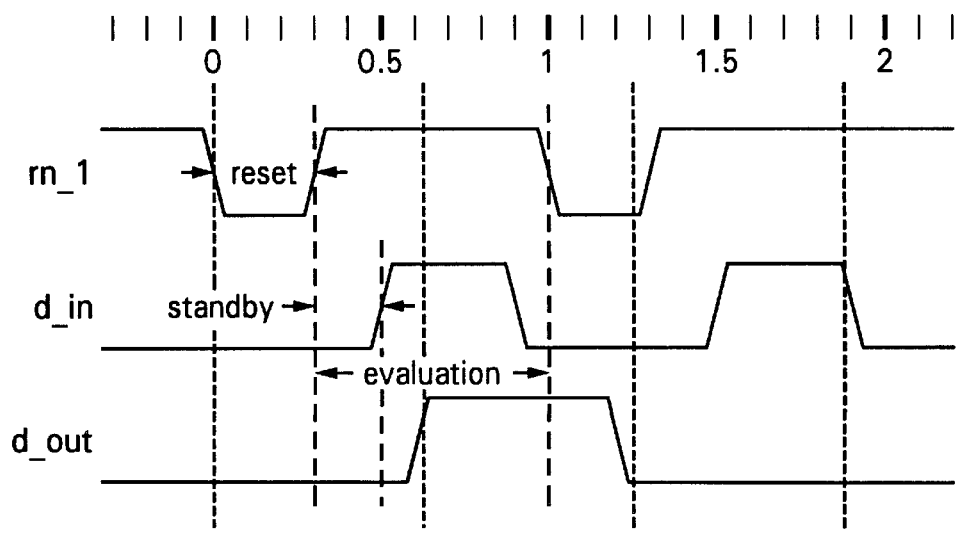
FIG. 9 depicts a timing diagram for the operational phases of dynamic circuits such as the circuit of FIG. 8.

The basic operation of the circuit shown is similar to the operation previously described for the footed domino circuit of FIG. 8. Foot transistor QR32 corresponds to foot transistor QR2 depicted in FIG. 8, operating in the same manner. Transistors QF1, QF2, QF6, QF7, QF8, QF9, QF12, QF13, QF14, and QF15 replace transistor QF1 depicted in FIG. 8, generating the sum output s and its complement sn utilizing the inputs s1, s2, and s3, and their complements s1n, s2n, and s3n. Transistors QR19, QS20, QS26, and QF30 form an output stage and serve the same functions with respect to sum output s as are served by transistors QR3, QS4, QF5, and QF6, respectively, with respect to output d_out within the circuit depicted in FIG. 8. Similarly, transistors QR22, QS21, QS28, and QF31 form a second output stage and serve the same functions with respect to complementary sum output sn as are served by transistors QR3, QS4, QF5, and QF6, respectively, with respect to output d_out within the circuit of FIG. 8.

Only one output s or sn of the circuit depicted in FIG. 4 is active during an evaluation phase, and both outputs s and sn are inactive during the reset phase. More important for the present invention, however, is the timing of the output transitions with respect to transitions in other output driver circuits. If the circuit of FIG. 4 is employed to drive an interconnect for, say, a category 2 interconnect as depicted in FIG. 3, the resets of circuits driving the corresponding interconnects must be timed so that the category 1 interconnect is stable when the category 2 interconnect carries a rising or falling signal, and vice versa.

Figure 5:
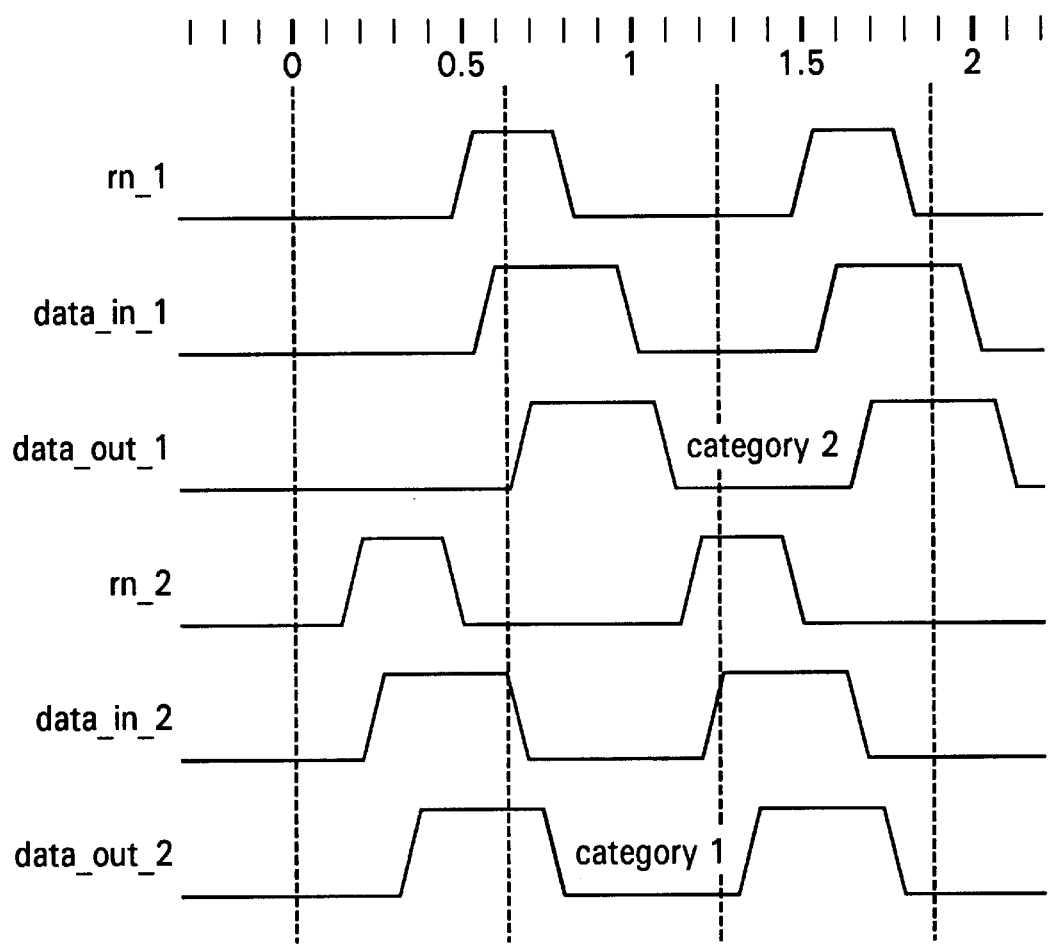
FIG. 5 depicts a timing diagram for offset timing of dynamic circuits driving categorized, interdigitated interconnects within a portion of a processor employing quiet lines in accordance with a preferred embodiment of the present invention.

With reference now to FIG. 5, a timing diagram for offset timing of dynamic circuits driving categorized, interdigitated interconnects within a portion of a processor employing quiet lines in accordance with a preferred embodiment of the present invention is depicted. Reset rn_1 is the reset input for a dynamic circuit of the type shown in FIG. 4 which drives a category 2 interconnect, while reset rn_2 is the reset input for a dynamic circuit driving a category 1 interconnect. As indicated, output data_out_2 driving the category 1 interconnect is either high or low, when output data_out_1 driving the category 2 interconnect is rising or falling. This is accomplished by tuning resets rn_1 and rn_2.

Figure 6:
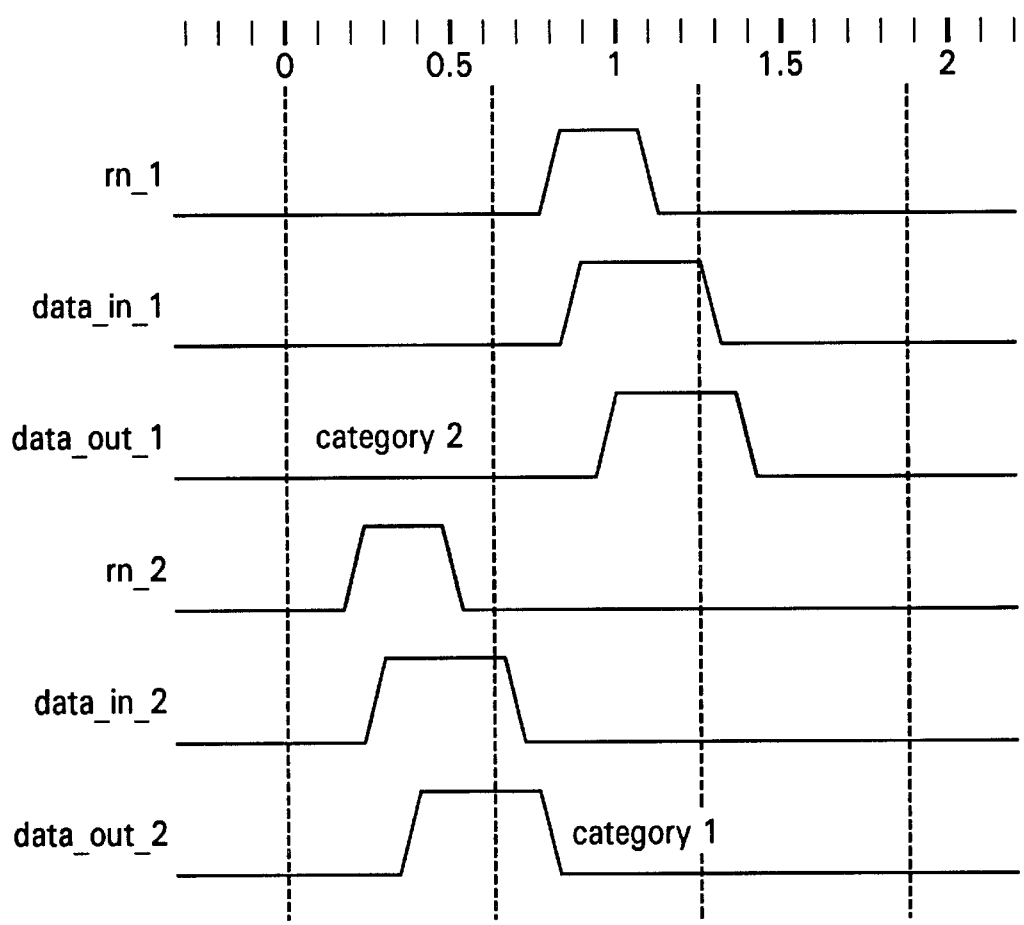
FIG. 6 is an alternative timing diagram for offset timing of dynamic circuits driving categorized, interdigitated interconnects within a portion of a processor employing quiet lines in accordance with a preferred embodiment of the present invention.
Figure 7A:
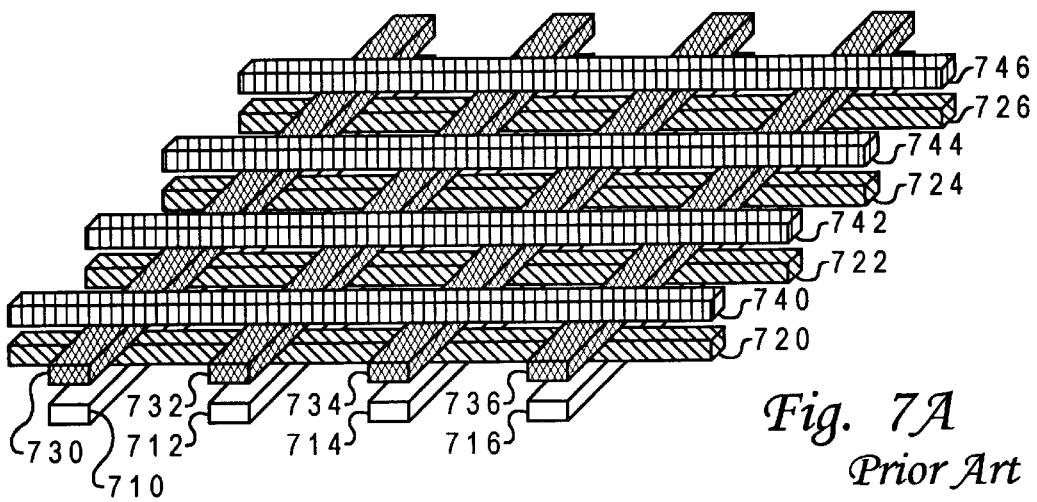
FIGS. 7A–7C depict and isometric view, a cross-sectional view, and a circuit model, respectively, for layers of metal interconnects within an integrated circuit device such as a processor.
Figure 7B:
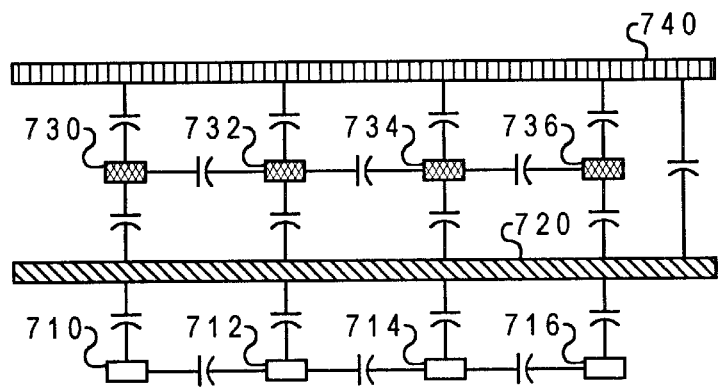
Figure 7C:
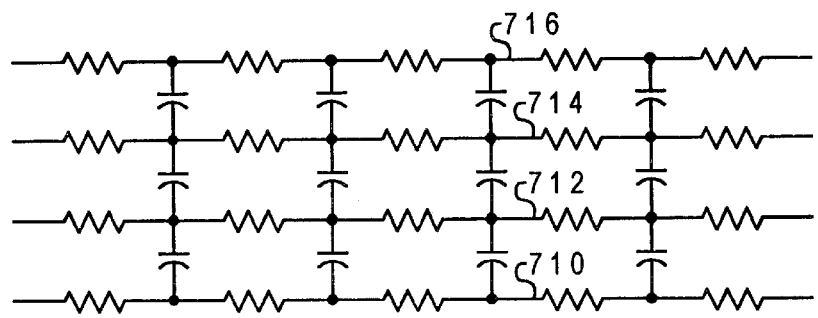

Referring to FIG. 6, a alternative timing diagram for offset timing of dynamic circuits driving categorized, interdigitated interconnects within a portion of a processor employing quiet lines in accordance with a preferred embodiment of the present invention is depicted. As with FIG. 5, reset rn_1 is the reset input for a dynamic circuit of the type shown in FIG. 4 which drives a category 2 interconnect while reset rn_2 is the reset input for a dynamic circuit driving a category 1 interconnect. In this case, however, output data_out_2 driving the category 1 interconnect is low when output data_out_1 driving the category 2 interconnect is rising, high, and/or falling. Similarly, output data_out_1 driving the category 2 interconnect is low when output data_out_2 driving the category 1 interconnect is rising, high, and/or falling. While the evaluation phases overlapped for dynamic circuits driving category 1 and 2 interconnects as depicted in FIG. 5 overlapped, the evaluation phases for dynamic circuits driving category 1 and 2 interconnects as depicted in FIG. 6 are completely offset. While completely offsetting the evaluation phases imposes greater timing constraints and requires longer period for transmitting both data outputs, the tuning of resets for the dynamic circuits is not subject to tolerances having the same stringency as overlapping evaluation phases.

The present invention creates interdigitated quiet lines by categorizing interconnects based on the expected timing of data transitions within the signals they carry. By properly interdigitating data lines and tuning resets for driving circuits so that alternating lines are quiet at any given time, false transitions resulting from capacitive coupling are avoided. Foot devices connected to the circuits eliminate any effect of capacitive coupling between an interconnect and a quiet line.

While the invention has been particularly shown and described with reference to a preferred embodiment, it will be understood by those skilled in the art that various changes in form and detail may be made therein without departing from the spirit and scope of the invention.

What is claimed is:

1. A method of preventing capacitive coupling between interconnects in an integrated circuit, comprising:

classifying interconnects expected to carry a voltage transition only during a first portion of a processor cycle in a first category;

classifying interconnects expected to carry a voltage transition only during a second portion of the processor cycle different than the first portion in a second category; and interdigitating the first and second category interconnects in signal buses of parallel interconnects traversing a portion of the integrated circuit.

2. The method of claim 1, wherein the step of classifying interconnects expected to carry a voltage transition only during a first portion of a processor cycle in a first category further comprises:

classifying interconnects carrying a data signal arriving at an execution unit at a beginning of the processor cycle and traversing a first portion of the execution unit in the first category.

3. The method of claim 1, wherein the step of classifying interconnects expected to carry a voltage transition only during a second portion of the processor cycle different than the first portion in a second category further comprises:

classifying interconnects carrying a data signal arriving at an execution unit at an interval of time after the beginning of the processor cycle and traversing a second portion of the execution unit in the second category.

4. The method of claim 1, further comprising:

classifying interconnects expected to carry a voltage transition only during a third portion of the processor cycle different than the first and second portions in a third category.

5. The method of claim 4, wherein the step of interdigitating the first and second category interconnects in signal buses of parallel interconnects traversing a portion of the integrated circuit further comprises:

interdigitating the first and second category interconnects over a first portion of the integrated circuit; and interdigitating the first and third category interconnects over a second portion of the integrated circuit different than the first portion.

6. The method of claim 4, wherein the step of interdigitating the first and second category interconnects in signal buses of parallel interconnects traversing a portion of the integrated circuit further comprises:

arranging the first, second, and third category interconnects over a portion of the integrated circuit so that interconnects within each pair of adjacent interconnects belong to different categories.

7. A method of preventing capacitive coupling between interconnects in an integrated circuit, comprising:
permitting driver circuits driving first, second, and third interconnects to drive transitioning data signals while driver circuits for fourth and fifth interconnects are driving data signals at a stable level, wherein the fourth interconnect is located between the first and second interconnects and the fifth interconnect is located in between the second and third interconnects;
connecting each of the fourth and fifth interconnects to a foot device while the driver circuits for the first, second, and third interconnects are driving transitioning data signals; and
preventing the driver circuits driving the first, second, and third interconnects from driving transitioning data signals and connecting each of the first, second, and third interconnects to a foot device when the driver circuits driving the fourth and fifth interconnects are driving transitioning data signals.

8. The method of claim 7, wherein the step of permitting driver circuits driving first, second, and third interconnects to drive transitioning data signals while driver circuits for fourth and fifth interconnects are driving data signals at a stable level further comprises:
asserting reset signals to the driver circuits driving the first, second, and third interconnects when data input signals to the driver circuits driving the fourth and fifth interconnects complete a voltage level transition during a processor cycle.

9. The method of claim 8, wherein the step of asserting reset signals to the driver circuits driving the first, second, and third interconnects when data input signals to the driver circuits driving the fourth and fifth interconnects complete a voltage level transition during a processor cycle further comprises:
asserting the reset signals to the driver circuits driving the first, second, and third interconnects when the data input signals to the driver circuits driving the fourth and fifth interconnects complete a low-to-high voltage level transition.

10. The method of claim 8, wherein the step of asserting reset signals to the driver circuits driving the first, second, and third interconnects when data input signals to the driver circuits driving the fourth and fifth interconnects complete a voltage level transition during a processor cycle further comprises:
asserting the reset signals to the driver circuits driving the first, second, and third interconnects when the data input signals to the driver circuits driving the fourth and fifth interconnects complete both a low-to-high voltage level transition and a high-to-low voltage level transition.

11. The method of claim 7, wherein the step of connecting each of the fourth and fifth interconnects to a foot device while the driver circuits for the first, second, and third interconnects are driving transitioning data signals further comprises:
coupling the fourth interconnect to a source of a foot transistor;
connecting a drain of the foot transistor to a ground voltage; and
connecting a gate of the foot transistor to a reset signal asserted when the driver circuits for the first, second, and third interconnects are enabled.

12. The method of claim 7, further comprising:
driving the first, second, third, fourth, and fifth interconnects with dynamic circuits; and
tuning resets to the dynamic circuits to completely offset reset, stand-by, and evaluation phases for a first dynamic circuit driving the first interconnect from reset, stand-by, and evaluation phases for a second dynamic circuit driving the fourth interconnect.

13. The method of claim 7, further comprising:
driving the first, second, third, fourth, and fifth interconnects with dynamic circuits; and
tuning resets to the dynamic circuits to overlap a steady-state portion of a phase for a first dynamic circuit driving the first interconnect with a transition portion of a phase for a second dynamic circuit driving the fourth interconnect and to overlap a transition portion of the phase for the first dynamic circuit with a steady-state portion of the phase for the second dynamic circuit.

14. A method of preventing capacitive coupling between interconnects in an integrated circuit, comprising:
creating a quiet line between a pair of interconnects during a period within a processor cycle in which drivers for the interconnect pair are enabled; and
disabling the drivers for the interconnect pair during a remaining period within the processor cycle.

15. The method of claim 14, wherein the step of creating a quiet line between a pair of interconnects during a period within a processor cycle in which drivers for the interconnect pair are enabled further comprises:
driving an interconnect located between the interconnects within the interconnect pair at a constant voltage level.

16. The method of claim 14, wherein the step of creating a quiet line between a pair of interconnects during a period within a processor cycle in which drivers for the interconnect pair are enabled further comprises:
coupling an interconnect located between the interconnects within the interconnect pair to a foot device.

17. The method of claim 16, wherein the step of coupling an interconnect located between the interconnects within the interconnect pair to a foot device further comprises:
coupling an interconnect expected to transmit a voltage level transition during the remaining period within the processor cycle to the foot device.

18. The method of claim 16, wherein the step of coupling an interconnect located between the interconnects within the interconnect pair to a foot device further comprises:
coupling an extra interconnect not employed to carry data signals to the foot device.

19. A mechanism for preventing capacitive coupling between interconnects, comprising:
a plurality of parallel interconnects classified in at least two categories, wherein interconnects within the plurality are alternated by category so that an interconnect in a second category is disposed between a pair of interconnects in a first category and an interconnect in the first category is disposed between a pair of interconnects in the second category; and
driving circuits for each interconnect within the plurality of interconnects, the driving circuits timed to drive voltage level transitions on interconnects in the first category only during a period when interconnects in the second category are quiet and to drive voltage level transitions on interconnects in the second category only during a period when interconnects in the first category are quiet.

20. The mechanism of claim 19, wherein the plurality of interconnects further comprise:
   interconnects running in parallel for a length of at least 300 to 500 microns.

21. The mechanism of claim 19, wherein the plurality of interconnects further comprise:
   data signal buses carrying operands to and over segments of an execution unit.

22. The mechanism of claim 19, wherein interconnects in the first category carry data signals arriving at a beginning of a processor cycle and interconnects in the second category carry data signals arriving after an interval of time during the processor cycle.

23. The mechanism of claim 19, wherein the driving circuit comprise dynamic driving circuits.

24. The mechanism of claim 23, wherein the dynamic driving circuit further comprise:
   reset signals tuned to prevent simultaneous voltage level transitions on adjacent interconnects.

* * * * *

UNITED STATES PATENT AND TRADEMARK OFFICE
CERTIFICATE OF CORRECTION

PATENT NO. : 6,189,133 B1
DATED : February 13, 2001
INVENTOR(S) : C.M. Durham et al.

It is certified that error appears in the above-identified patent and that said Letters Patent is hereby corrected as shown below:

Column 11,
Line 26, please delete "driving" and insert -- drive --.

Column 14,
Line 1, please insert -- elapses -- after the word "time".

Signed and Sealed this

Eighteenth Day of December, 2001

*Attest:*

*Attesting Officer*

JAMES E. ROGAN
*Director of the United States Patent and Trademark Office*